(12) United States Patent
Yamazaki et al.

(10) Patent No.: US 6,507,010 B1
(45) Date of Patent: Jan. 14, 2003

(54) CONTACT AREA SENSOR

(75) Inventors: Shunpei Yamazaki, Tokyo (JP); Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/568,126

(22) Filed: May 10, 2000

(30) Foreign Application Priority Data

May 11, 1999 (JP) .......................................... 11-129473

(51) Int. Cl.[7] .............................................. H01L 27/00
(52) U.S. Cl. ................................... 250/208.1; 358/513
(58) Field of Search .................... 250/208.1, 227.26; 358/513, 514

(56) References Cited

U.S. PATENT DOCUMENTS

| | | | | |
|---|---|---|---|---|
| 5,565,700 A | * | 10/1996 | Chou et al. ................. | 257/408 |
| 5,991,467 A | * | 11/1999 | Kamiko .................... | 250/208.1 |
| 6,087,648 A | * | 7/2000 | Zhang et al. ............. | 250/208.1 |
| 6,157,072 A | * | 12/2000 | Nakayama et al. ......... | 257/443 |
| 6,243,069 B1 | * | 6/2001 | Ogawa et al. ............... | 345/102 |
| 6,243,155 B1 | * | 6/2001 | Zhang et al. .................. | 257/57 |
| 6,277,679 B1 | * | 8/2001 | Ohtani ........................ | 438/151 |

FOREIGN PATENT DOCUMENTS

| | | |
|---|---|---|
| JP | 5-335539 | 12/1993 |
| JP | 6-18845 | 1/1994 |
| JP | 6-22250 | 1/1994 |
| JP | 9-219823 | 8/1997 |

* cited by examiner

*Primary Examiner*—Robert H. Kim
*Assistant Examiner*—Hoon K. Song
(74) *Attorney, Agent, or Firm*—Eric J. Robinson; Robinson Intellectual Property Law Office, P.C.

(57) ABSTRACT

A contact area sensor which is small, thin, and light, and can withstand a shock is provided. A contact area sensor provided with sensor portions arranged in a matrix form on a substrate which transmits light is formed, the sensor portions comprising a thin film transistor (TFT) and a photodiode. LEDs are used as a light source, and the driving method of image reading is RGB light source switching. Further, the contact area sensor is structured to be capable of dividedly reading a large area image and connecting the divided images on a software, and is structured to organize read letters as a data.

18 Claims, 9 Drawing Sheets

LIGHT

CONTACT AREA SENSOR

BACKGROUND OF THE INVENTION

1. Field of the Invention

The present invention relates to a contact area sensor having a function as an image sensor. More particularly, the present invention relates to a contact area sensor formed of a plurality of thin film transistors (TFTs) arranged in a matrix form.

2. Description of the Related Art

Recently, solid-state imaging devices having a photoelectric conversion element such as a CCD for reading image signals from light signals of literal or graphic information on paper, picture information, or the like have come into popular use. Such solid-state imaging devices are used as scanners, digital cameras, and the like.

Solid-state imaging devices using a CCD as the photoelectric conversion element include into line sensors and area sensors.

FIG. 4A schematically illustrates a conventional solid-state imaging device using a line sensor having a CCD as the photoelectric conversion element. A light source 401, a line sensor 402, and an object 403 are provided as shown in the figure. The light source 401 and the line sensor 402 scan the object 403 in a scanning direction at a constant speed. Light irradiated from the light source 401 is reflected by the object 403, and the reflected light is read by the line sensor 402 and is converted into image signals.

FIG. 4B schematically illustrates the line sensor 402. The line sensor 402 is formed of a CCD 404 and an optical system 405. The CCD 404 is formed of a plurality of small CCDs (multiple chips). Light which enters the line sensor 402 is focused by the optical system 405 and enters the CCD 404. The light which enters the CCD 404 is converted into image signals as electric signals, and the image is read.

In case of such a conventional solid-state imaging device the light-receiving portion of which is a line sensor, it is necessary to scan the object with the line sensor. However, if the scan is made manually, it is difficult to make the scan in a constant direction. If a machine is used to make the line sensor scan, since a motor and the like for scanning are provided, there are problems that the solid-state imaging device itself can not be made smaller, thinner, and lighter, the power consumption can not be suppressed, and the solid-state imaging device is easily affected by a shock.

Further, in case of such a conventional solid-state imaging device the light-receiving portion of which is a line sensor, the substrate of the CCD is a silicon substrate. This makes it necessary to make light for reading the image of the object enter between the CCD provided in the line sensor and the object. This, in turn, makes it necessary to provide between the CCD provided in the line sensor and the object the optical system 405 for focusing an image to be read, which prevents the solid-state imaging device itself from becoming smaller, thinner, and lighter.

On the other hand, there are also solid-state imaging devices using an area sensor having a CCD as the photoelectric conversion element. Area sensors having a CCD as the photoelectric conversion element are used in video cameras, digital cameras, and the like.

In case of such a solid-state imaging device the light-receiving portion of which is an area sensor, differently from the case of the line sensor, it is not necessary to scan the object with the light-receiving portion. However, since, similarly to the case of the line sensor, the CCD is formed on a silicon substrate, it is necessary to make light for reading the image of the object enter between the CCD provided in the area sensor and the object. This makes it necessary to provide an optical system for focusing an image to be read, which prevents the solid-state imaging device itself from becoming smaller, thinner, and lighter.

Further, since the size of the silicon substrate is limited, when a CCD is used, it is difficult to form an area sensor having a large area.

Further, in a conventional solid-state imaging device, a color image is read by white light passing through color filters of red, green, and blue provided above the respective pixels of the CCD. In other words, three pixels corresponding to red, green, and blue color filters, respectively, as one group, read a color image. Therefore, in this conventional method, the resolution is one third of the actual resolution. For example, in order that the area sensor reads a VGA color image of 640×480, 640×3×480 pixels are necessary. In order that the area sensor reads a SVGA color image of 800×600, 800×3×600 pixels are necessary. In this way, in the conventional method, the resolution of the read image is only one third of the actual number of the pixels.

As described in the above, it is difficult to make smaller, thinner, and lighter the conventional solid-state imaging device using a CCD as the photoelectric conversion element. Further, the solid-state imaging device is easily affected by a shock.

SUMMARY OF THE INVENTION

Accordingly, the present invention is made in view of the above, and an object of the invention is to provide a contact area sensor which is small, thin, and light, and can withstand a shock.

In order to solve the above problems, according to the present invention, a contact area sensor provided with sensor portions arranged in a matrix form on a substrate which transmits light such as of glass or quartz is formed, the sensor portions comprising a thin film transistor (TFT) and a photodiode. This structure makes it unnecessary to provide a complicated optical system for making light for reading the image of an object enter between the area sensor and the object and for focusing the image to be read, which can make the contact area sensor itself smaller, thinner, and lighter.

Further, with regard to the contact area sensor having thin film transistors arranged in a matrix form, differently from the case of a line sensor, it is not necessary to scan the object, which makes the operation easier. Besides, since it is not necessary to provide a motor and the like for scanning, the contact area sensor itself can be made smaller, thinner, and lighter, the power consumption can be suppressed, and the contact area sensor can withstand a shock.

Further, the peripheral circuit can be formed, using thin film transistors, on the same substrate on which the contact area sensor is formed. This makes it possible to make the contact area sensor further smaller, thinner, and lighter, and more portable contact area sensor can be formed.

Further, according to the present invention, lower power consumption is materialized by using LEDs as the light source. Further, by adopting RGB light source switching as the driving method of image reading, the resolution of the image reading is tripled, and highly precise image reading with high image quality is made possible.

Further, the contact area sensor is structured to be capable of dividedly reading a large area image and connecting the divided images on a software. This makes it possible to read a large area which is larger than the readable area by the area sensor.

Still further, the contact area sensor is structured to be capable of organizing the read letters as a data. By tripling the resolution of the image reading, the organization of the read letters as a data can be carried out with more certainty and more accuracy.

DETAILED DESCRIPTION OF THE PREFERRED EMBODIMENTS

Figure 1:
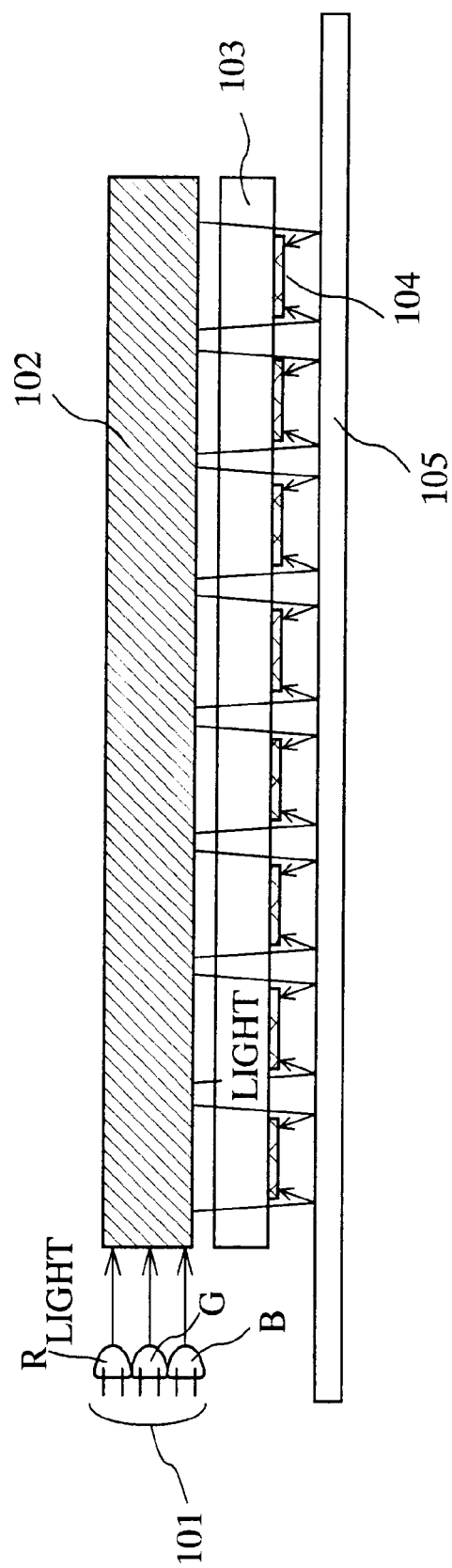
FIG. 1 is a sectional view of an area sensor according to the present invention.

A typical embodiment mode for carrying out the present invention is described in the following. FIG. 1 is a schematic view seen from a side of a contact area sensor according to the present invention.

A contact area sensor comprising LEDs 101 as a light source formed of red (R), green (G), and blue (B) LEDs, a light scattering layer 102, and a sensor substrate 103 and a sensor portion 104 both of which transmit light is provided as shown in FIG. 1. An object 105 is positioned on the side of the sensor portion 104 of the sensor substrate 103.

Light from one among the R, G, and B LEDs 101 enters the light scattering layer 102. The incident light evenly irradiates the sensor substrate 103 by the hands of the light scattering layer 102. Since the sensor substrate 103 transmits light, the irradiated light passes through the sensor substrate 103 to reach the object 105.

Light which reached the object 105 but was not absorbed by the object 105 and was reflected enters the sensor portion 104 provided on the sensor substrate 103 to generate image signals as electric signals.

Figure 2:
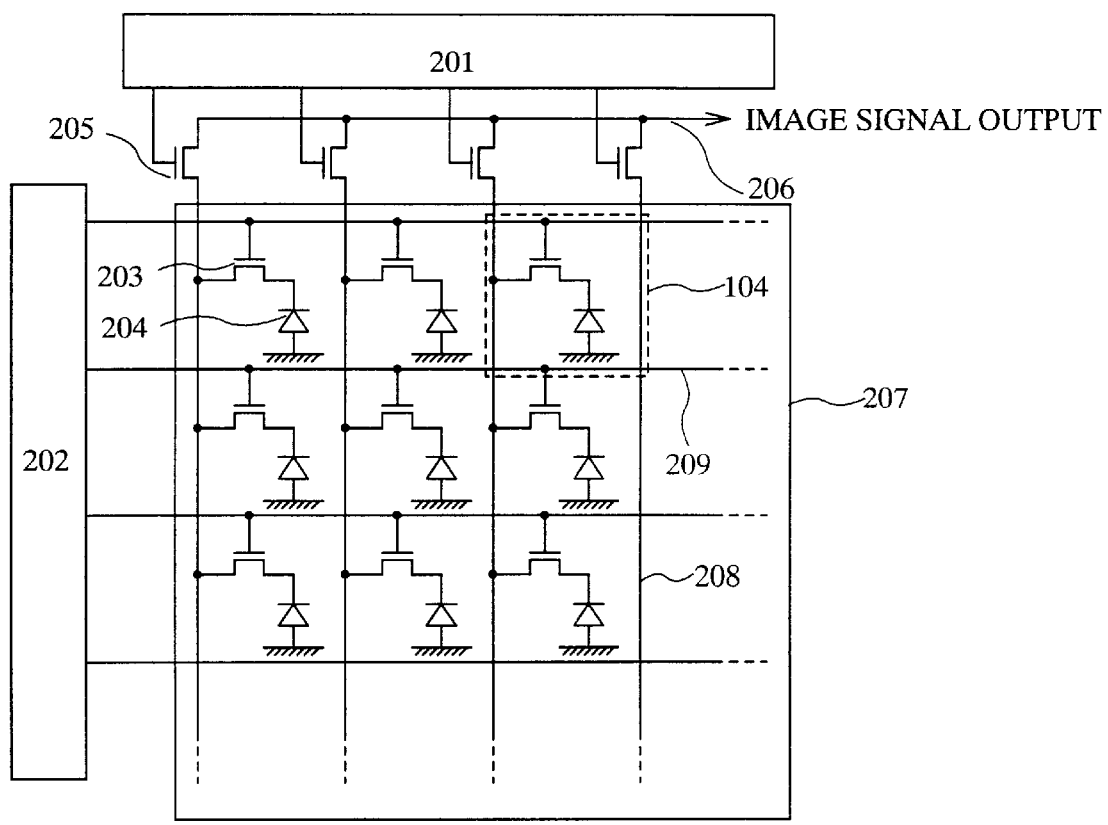
FIG. 2 is a circuit diagram of the area sensor according to the present invention.

With reference to FIG. 2, the operation of the sensor portion 104 provided on the sensor substrate 103 is described. A horizontal shift register 201, a vertical shift register 202, and an image reading portion 207 having a plurality of sensor portions 104, an analog switch 205, an image signal line 206, signal lines 208, and scanning lines 209 are provided on the sensor substrate 103 as shown in FIG. 2. Each of the sensor portions 104 has a sensor TFT 203 and a photodiode 204.

When a gate signal is supplied from the vertical shift register 202 through a scanning line 209 to a gate electrode of the sensor TFT 203, the sensor TFT 203 is turned on, and a cathode electrode or an anode electrode of the photodiode 204 is in continuity with a source region of the sensor TFT 203.

With this state maintained, light reflected by the object enters the photodiode 204. Data with regard to one pixel generated at the photodiode 204 by photoelectric conversion is inputted through a signal line 208 to a source region of the analog switch 205 as an image signal. When gate signals from the horizontal shift register 201 are sequentially supplied to gate electrodes of thin film transistors of the analog switches 205, the thin film transistors of the analog switches 205 are sequentially turned on, and image signals each of which are for one pixel are sequentially outputted from the image signal line 206.

The image signals outputted from the image signal line 206 are taken in by other peripheral circuits (such as a memory and a CPU).

Next, the driving method of image reading in the contact area sensor according to the present invention is described. The LEDs 101 as the light source shown in FIG. 1 emit light by RGB light source switching. In the image reading portion of the contact area sensor, the period until all the sensor portions 104 read one image is referred to as one image frame period. The RGB light source switching is a method where one image frame period is time shared into three, R, G, and B LEDs as the backlight are sequentially lighted in corresponding ⅓ frame periods (subframe periods), and image corresponding to the respective colors is read for the corresponding ⅓ frame periods (subframe periods).

Figure 3:
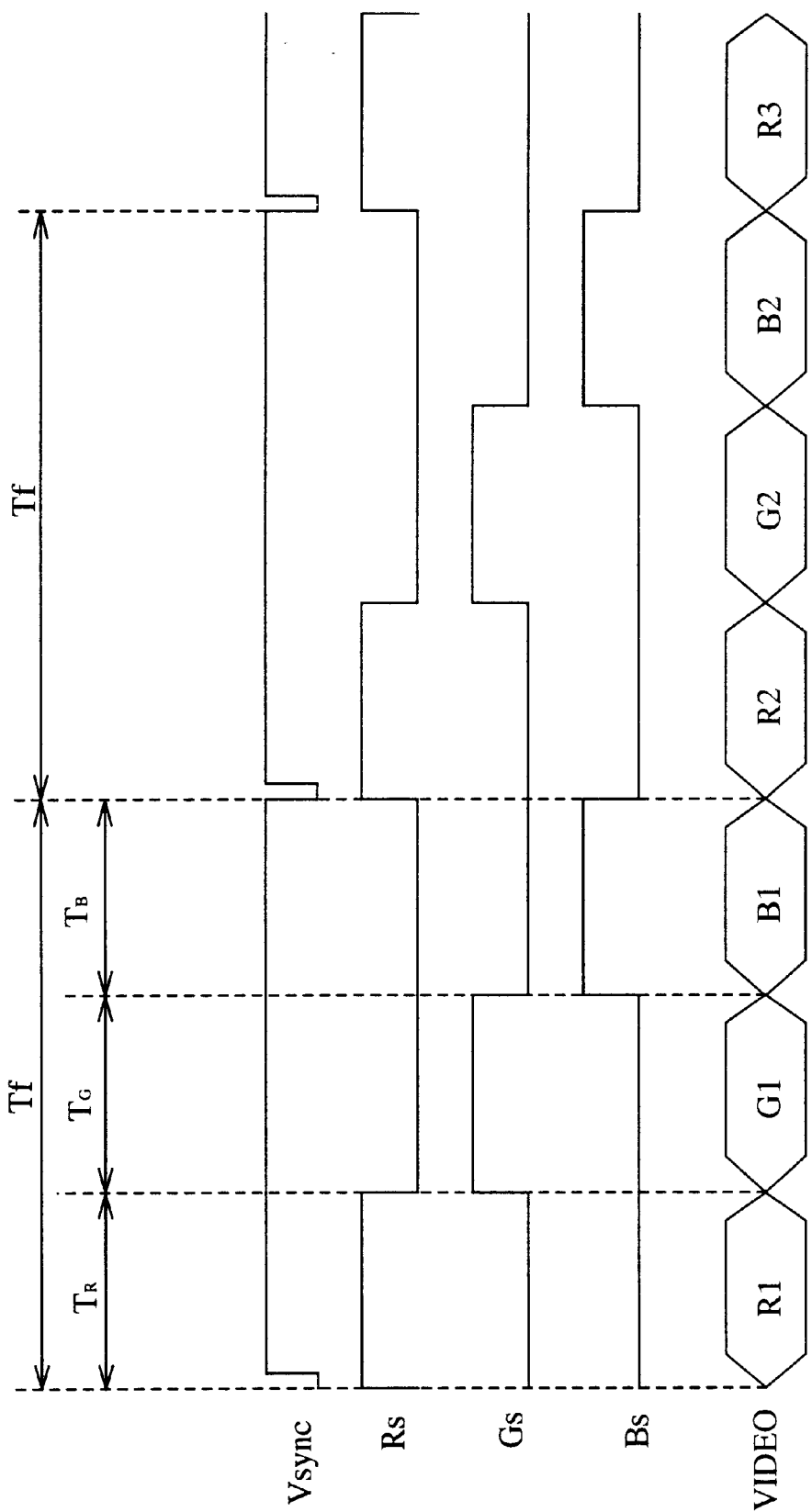
FIG. 3 is a timing chart of RGB light source switching according to the present invention.
Figure 4A:
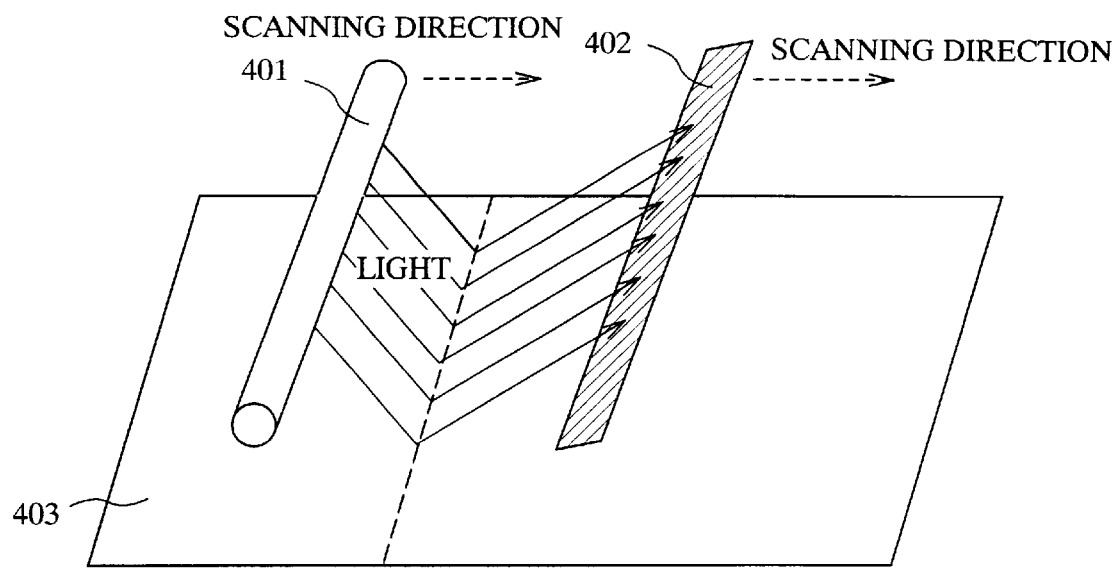
FIGS. 4A and B are schematic views of a conventional line sensor having a CCD as the photoelectric conversion element.
Figure 4B:
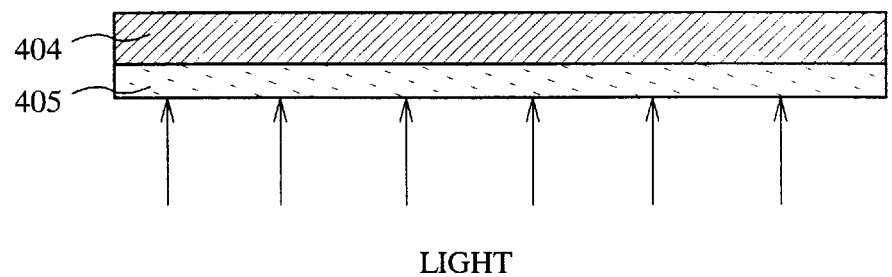

FIG. 3 shows a timing chart of the RGB light source switching. In the timing chart of the RGB light source switching shown in FIG. 3, a start signal of image signal writing ($V_{sync}$ signal), timing signals ($R_s$, $G_s$, and $B_s$) for lighting red (R), green (G), and blue (B) LEDs, respectively, an image signal (VIDEO) are shown. Tf denotes a frame period. $T_R$, $T_G$, and $T_B$ are periods for which the red (R), green (G), and blue (B) LEDs are lighted, respectively.

The period $T_R$, $T_G$, or $T_B$ for which the red (R), green (G), or blue (B) LEDs are lighted is one frame period (Tf) divided into three in the direction of the timing axis.

In the RGB light source switching, the R, G, and B LEDs are sequentially lighted in the corresponding LED lighting periods $T_R$, $T_G$, and $T_B$, respectively. During the period $T_R$ for which the red LED is lighted, the red light irradiates the object. The irradiated red light is reflected by the object, enters the photodiode, and is converted into an image signal R1 for one pixel of a red image to be supplied to the image signal line. During the period $T_G$ for which the green LED is lighted, similarly, the green light irradiates the object. The green light reflected by the object is converted by the photodiode into an image signal G1 for one pixel of a green image to be supplied to the image signal line. During the period $T_B$ for which the blue LED is lighted, similarly, the blue light irradiates the object. The blue light reflected by the object is converted by the photodiode into an image signal B1 for one pixel of a blue image to be supplied to the image signal line. These three writing of the image form one frame.

The resolution of the reading of an image according to the RGB light source switching is three times as much as that of a conventional structure where each of the pixels is provided with one among R, G, and B color filters. It is to be noted that, though R, G, and B are used as the three primary colors of light in the present embodiments, the three primary colors of light to be used in the present invention is not limited thereto.

As described in the above, by forming a contact area sensor comprising thin film transistors (TFTs) and photodiodes arranged in a matrix form, the contact area sensor itself can be made smaller, thinner, and lighter. Further, the trouble of scanning an object is alleviated, the operation is made easier, the power consumption is suppressed, and the sensor is made to withstand a shock.

Further, it is made possible to form the peripheral circuit other than the contact area sensor on the same substrate on which the contact area sensor is formed. This makes it possible to make the contact area sensor further smaller, thinner, and lighter, and more portable contact area sensor can be formed.

Further, according to the present invention, lower power consumption is materialized by using LEDs as the light source.

Further, it is made possible to connect divided images on a software, and to read a large area image which is larger than the readable area by the area sensor.

Further, the contact area sensor is structured to have a function as an OCR for organizing read letters as a data. By making the resolution of the image reading three times as much as that of a conventional structure where each of the pixels is provided with one among R, G, and B color filters, the organization of read letters as a data can be carried out with more certainty and more accuracy.

Embodiments of the present invention is now described with reference to FIGS. 5A–9B.

Embodiment 1

In the present embodiment, an example of a method of manufacturing thin film transistors of the contact area sensor according to the present invention is described with reference to FIGS. 5A–7B. Here, an example where an n-channel type TFT of the sensor portion of the contact area sensor and a CMOS circuit formed of an n-channel type TFT and a p-channel type TFT of a driving circuit of the contact area sensor are formed on the same substrate is described.

The sensor substrate 6001 is a substrate which transmits light such as a glass substrate, a plastic substrate, or a ceramic substrate. Of course, a quartz substrate may also be used.

An underlying film 6002 of silicon nitride and an underlying film 6003 of silicon oxide are formed on a main surface of the sensor substrate 6001 on which the TFTs are to be formed. These underlying films are formed by, for example, plasma CVD or sputtering, and are provided for the purpose of preventing impurity, which may otherwise change the characteristics of the TFTs, from diffusing from the sensor substrate 6001 into the semiconductor layers. In order to attain this, the underlying film 6002 of silicon nitride is formed at the thickness of 20–100 nm, typically 50 nm, and the underlying film 6003 of silicon oxide is formed at the thickness of 50–500 nm, typically 150–200 nm.

Of course, only one of the underlying film 6002 of silicon nitride and the underlying film 6003 of silicon oxide may be the underlying film, but, taking the reliability of the TFTs into consideration, it is most preferable that the underlying film is structured to be two-layered.

Preferably, a semiconductor layer formed in contact with the underlying film 6003 uses a crystalline semiconductor formed by crystallizing by laser crystallization or solid phase growth by heat treatment an amorphous semiconductor which itself is formed by plasma CVD, low pressure CVD, sputtering, or the like. A microcrystalline semiconductor formed by plasma CVD, low pressure CVD, sputtering, or the like may also be used. Here, as the material of the semiconductor, silicon (Si), germanium (Ge), silicon germanium alloy, or silicon carbide may be used. A compound semiconductor material such as gallium arsenide may also be used.

The semiconductor layer is formed at the thickness of 10–100 nm, typically 50 nm. In an amorphous semiconductor film formed by plasma CVD, hydrogen is contained by 10–40 atom %. It is preferable that, prior to the crystallization process, heat treatment at 400–500° C. is carried out to desorb the hydrogen in the film, thereby making the hydrogen content 5 atom % or less. The amorphous silicon film may be formed by other methods such as sputtering and evaporation, but it is preferable that impurity elements such as oxygen and nitrogen contained in the film are sufficiently decreased.

Since the underlying films and the amorphous conductor film can be formed by the same method, the underlying film 6002, the underlying film 6003, and the semiconductor layer may be formed continuously. By doing so, after the respective films are formed, their surfaces are not exposed to the atmosphere, and thus, contamination of their surfaces can be prevented. As a result, one factor of causing variation in the characteristics of the TFTs can be eliminated.

The process of crystallizing the amorphous semiconductor film may be carried out by known laser crystallization or thermal crystallization. Also, a crystalline conductor film formed by thermal crystallization using a catalytic element may be used. By adding a gettering process with regard to the crystalline semiconductor film formed by thermal crystallization using a catalytic element to remove the catalytic element, excellent TFT characteristics can be obtained.

A resist mask is formed by known patterning using a first photomask on the crystalline semiconductor film formed in this way. Then, by dry etching, a first island-like semiconductor layer 6004, a second island-like semiconductor layer 6005, and a third island-like semiconductor layer 6006 are formed.

Figure 5A:
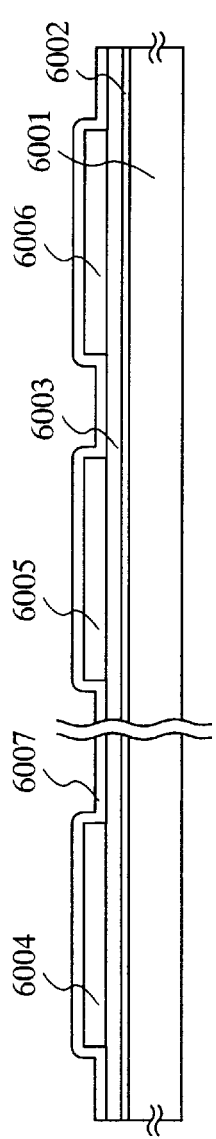
FIGS. 5A–D illustrate manufacturing steps of the contact area sensor according to Embodiment 1.

Then, a gate insulating film 6007 the main component of which is silicon oxide or silicon nitride is formed on the surface of the first, second, and third island-like semiconductor layers 6004, 6005, and 6006. The gate insulating film 6007 is formed by plasma CVD, sputtering, or the like at the thickness of 10–200 nm, preferably 50–150 nm (FIG. 5A).

Next, resist masks 6008, 6009, and 6010 are formed which cover the portion of the first island-like semiconductor layer 6004 where a channel forming region is to be formed, the whole surface of the second island-like semiconductor layer 6005, and the portion of the third island-like semiconductor layer 6006 where a channel forming region is to be formed, respectively.

Figure 5B:
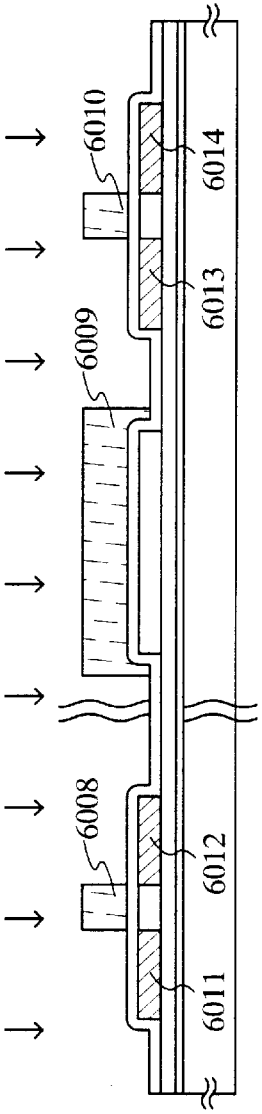

Then, a process of forming second impurity regions is carried out by doping an impurity element for n-type. Known impurity elements for n-type to be doped into the crystalline semiconductor material include phosphorus (P), arsenic (As), and antimony (Sb). Here, phosphorus is used, and is doped by ion doping phosphine ($PH_3$). In this process, for the purpose of doping phosphorus through the gate insulating film 6007 into the first island-like semiconductor layer 6004 and the third island-like semiconductor layer 6006 under the gate insulating film 6007, the acceleration voltage is set to be as high as 80 keV. The concentration of phosphorus doped into the first island-like semiconductor layer 6004 and the third island-like semiconductor layer 6006 is preferably in the range of $1\times10^{16}$–$1\times10^{19}$ atoms/ cm$^3$, and here, 1×10$^{18}$ atoms/cm$^3$. In the present embodiment, impurity for n-type is doped after the insulating film 6007 is formed, but forming the resist masks 6008, 6009, and 6010 and carrying out the doping may be done before the insulating film 6007 is formed. In this way, regions 6011, 6012, 6013, and 6014 with phosphorus being doped therein are formed in the first and third island-like semiconductor layer 6004 and 6006. A part of the second impurity regions functions as LDD regions (FIG. 5B).

Next, the resist masks 6008, 6009, and 6010 are removed. The resist masks may be removed using a commercially available alkaline stripper, but they are effectively removed by ashing. Ashing is a method of removing a resist by forming plasma in an oxidizing atmosphere and exposing a cured resist thereto. It is more effective to add water vapor to the atmosphere in addition to oxygen.

Figure 5C:
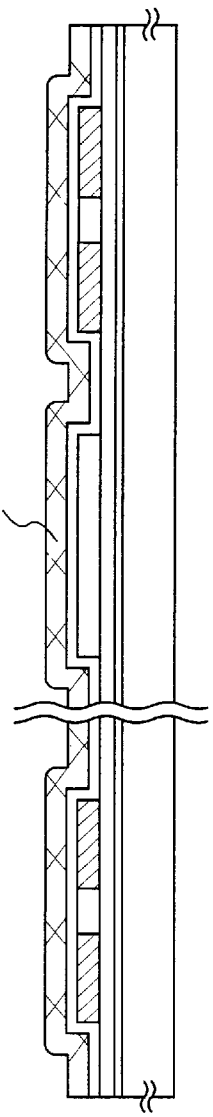

Then, a first conductive layer 6015 is formed on the surface of the gate insulating film 6007. The first conductive film 6015 is formed using a conductive material the main component of which is selected from Ta, Ti, Mo, and W at the thickness of 10–100 nm, preferably 150–400 nm (FIG. 5C).

In addition, as the first conductive layer 6015, for example, a compound such as Mo, TaN, MoTa, or WSix (x=2.4<X<2.7) may be used.

Conductive materials such as Ta, Ti, Mo, W have higher resistivity than that of Al and Cu, but in relation to the area of the circuit to be formed, they can be used with no problem as far as the area is about 100 cm$^2$ or less.

Then, using a third photomask, resist masks 6016, 6017, and 6018 are formed. The resist mask 6017 is for forming a gate electrode of the p-channel type TFT, while the resist masks 6016 and 6018 are for forming gate electrodes of the n-channel type TFTs.

Figure 5D:
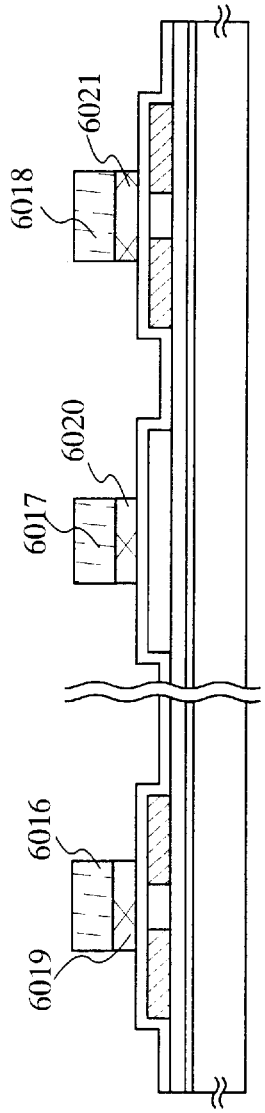

Unnecessary portions of the first conductive layer are removed by dry etching to form a first gate electrode 6019, a second gate electrode 6020, and a third gate electrode 6021. Here, if residue remains after the etching, it is effective to carry out ashing. Here, the first gate electrode 6019 is formed so as to overlap a part of the second impurity regions 6011 and 6012 with the gate insulating film 6007. The third gate electrode 6021 is formed so as to overlap a part of the second impurity regions 6013 and 6014 with the gate insulating film 6007 (FIG. 5D).

Figure 6A:
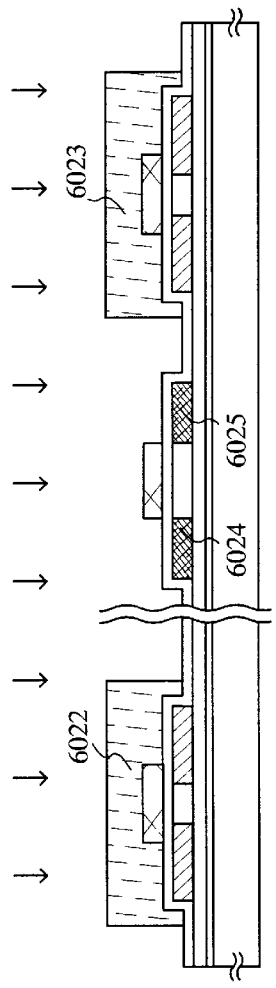
FIGS. 6A–C illustrate manufacturing steps of the contact area sensor according to Embodiment 1.

Then, the resist masks 6016, 6017, and 6018 are removed. Next, using a fourth photomask, resist masks 6022 and 6023 are formed so as to cover the island-like semiconductor layers 6004 and 6006. Then, a process of forming third impurity regions 6024 and 6025 is carried out by doping an impurity element for p-type into a part of the second island-like semiconductor layer 6005 where the p-channel type TFT is to be formed. Known impurity elements for p-type include boron (B), aluminum (Al), and gallium (Ga). Here, boron is used as the impurity element, and is doped by ion doping diborane (B$_2$H$_6$). Here, also, the acceleration voltage is set to be 80 keV. The concentration of boron is 2×10$^{20}$ atoms/cm$^3$. In this way, as shown in FIG. 6A, the third impurity regions 6024 and 6025 with boron being heavily doped therein are formed.

After the resist masks 6022 and 6023 are removed, resist masks 6029, 6030, and 6031 are formed using a fifth photomask. The resist mask 6029 is formed so as to cover the first gate electrode 6019 and so as to overlap a part of the second impurity regions 6011 and 6012. The resist mask 6031 is formed so as to cover the third gate electrode 6021 and so as to overlap a part of the second impurity regions 6013 and 6014. The resist masks 6029 and 6031 determine the amount of offset of the LDD regions.

Here, a part of the gate insulating film 6007 may be removed using the resist masks 6029 and 6031 to expose the surface of the semiconductor layer where the first impurity regions are to be formed. By doing so, the subsequent process of doping an impurity element for n-type can be carried out effectively.

Figure 6B:
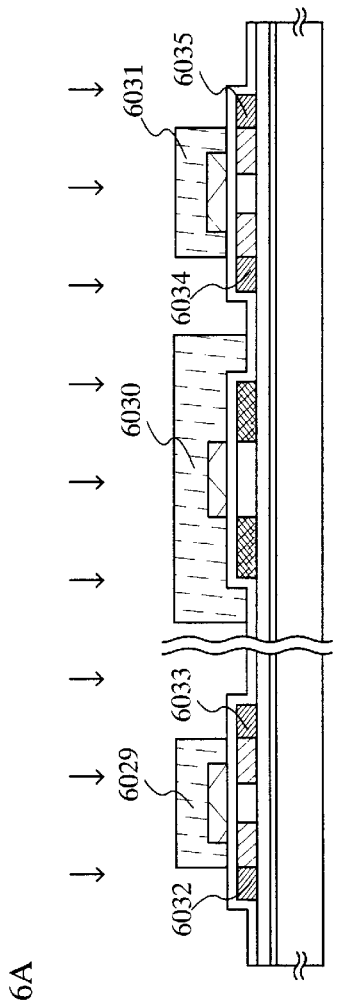

Then, a process of forming first impurity regions is carried out by adding an impurity element for n-type. In this way, first impurity regions 6032 and 6035 to be source regions and first impurity regions 6033 and 6034 to be drain regions are formed. Here, phosphine (PH$_3$) is doped by ion doping. In this process, also, for the purpose of doping phosphorus through the gate insulating film 6007 into the semiconductor layers under the gate insulating film 6007, the acceleration voltage is set to be as high as 80 keV. The concentration of phosphorus doped into these regions is higher than the concentration of the first impurity element for n-type, and is preferably 1×10$^{19}$–1–10$^{21}$ atoms/cm$^3$, and here, 1×10$^{20}$ atoms/cm$^3$ (FIG. 6B).

Next, a first interlayer insulating film 6036 and a second interlayer insulating film 6037 are formed on the surface of the gate insulating film 6007 and the first, second, and third gate electrodes 6019, 6020, and 6021. The first interlayer insulating film 6036 is formed of silicon nitride at the thickness of 50 nm. The second interlayer insulating film 6037 is formed of silicon oxide at the thickness of 950 nm. As the second interlayer insulating film, an organic film such as polyimide, polyamide, polyimideamide, acryl may be used.

The first interlayer insulating film 6036 of silicon nitride formed here is necessary for carrying out the subsequent heat treatment. More specifically, the first interlayer insulating film 6036 is effective in preventing oxidation of the surface of the first, second, and third gate electrodes 6019, 6020, and 6021.

For the purpose of activating the impurity elements for— or p-type added at the respective doses, the heat treatment has to be carried out. This process is carried out by thermal annealing using an electric heating furnace, laser annealing using excimer laser, rapid thermal annealing (RTA) using a halogen lamp, or the like. However, by laser annealing, though the activation can be carried out at a low substrate heating temperature, it is difficult to activate the regions under the gate electrodes. Therefore, here, the activation process is carried out by thermal annealing. This heating process is carried out in a nitrogen atmosphere at 300–700° C., preferably at 350–550° C., here at 450° C., for two hours.

In this heat treatment process, 3–90% of hydrogen may be added to the nitrogen atmosphere. Further after the heat treatment process, a hydrogenation treatment process is preferably carried out in an atmosphere containing 3–100% of hydrogen at 150–500 ° C., preferably at 300–450° C. for two to twelve hours. Alternatively, hydrogen plasma treatment may be carried out with the substrate temperature being at 150–500° C., preferably at 200–450° C. In any case, since hydrogen compensates defects remaining in the semiconductor layers or at the interfaces thereof, the characteristics of the TFTs can be improved.

After that, using a sixth photomask, a predetermined resist mask is formed on the first and second interlayer insulating films 6036 and 6037. Then, etching is carried out to form contact holes reaching the source region of the TFT of the sensor portion and the source regions and the drain regions of the TFTs of the driving portion. Then, a second conductive layer is formed, and by a patterning process using a seventh photomask, source electrodes 6038, 6040, and 6042 and a drain electrode 6041 are formed. Though now shown in the figures, in the present embodiment, these electrodes are used as three-layered electrodes formed by continuously forming a Ti film at the thickness of 100 nm, a film of Al containing Ti at the thickness of 300 nm, and a Ti film at the thickness of 150 nm by sputtering.

A channel forming region 6045, first impurity regions 6043 and 6047, and second impurity regions 6044 and 6046 are formed in the portion which is to be the n-channel type TFT of the sensor portion. Here, in the second impurity regions 6044 and 6046, regions 6044a and 6046a which overlap the first gate electrode 6019 (GOLD regions) and regions 6044b and 6046b which do not overlap the first gate electrode 6019 (LDD regions) are formed, respectively. The first impurity region 6043 is the source region, and the first impurity region 6047 is the drain region.

A channel forming region 6053, first impurity regions 6051 and 6055, and second impurity regions 6052 and 6054 are formed in the n-channel type TFT of the CMOS circuit of the driving portion. Here, in the second impurity regions, regions 60521a and 6054a which overlap the third gate electrode 6021 (GOLD regions) and regions 6052b and 6054b which do not overlap the third gate electrode 6021 (LDD regions) are formed, respectively. The first impurity region 6055 is the source region, and the first impurity region 6051 is the drain region.

Figure 6C:
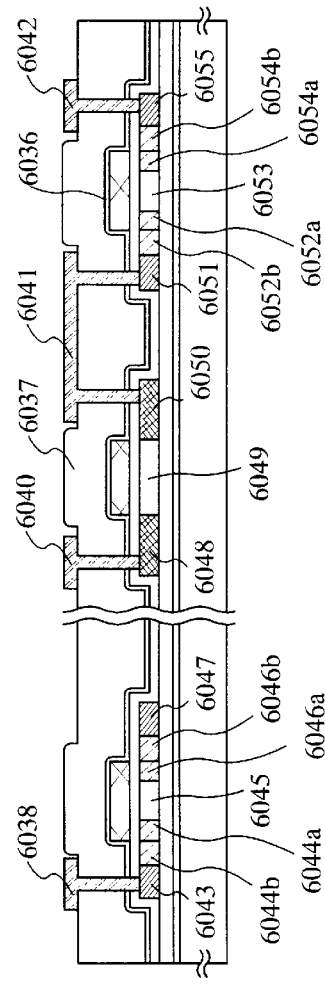

A channel forming region 6049 and third impurity regions 6048 and 6050 are formed in the p-channel type TFT of the CMOS circuit of the driving portion. The third impurity region 6048 is the source region, and the third impurity region 6050 is the drain region (FIG. 6C).

Then, a third interlayer insulating film 6059 is formed. The third interlayer insulating film 6059 is formed of silicon oxide at the thickness of 950 nm. Also, an organic resin film may be used as the third interlayer insulating film 6059 as well as the second interlayer insulating film 6037. Next, using an eighth photomask, a predetermined resist mask is formed. Then, etching is carried out to form a contact hole reaching the drain region of the TFT of the sensor portion. Then, a third conductive layer is formed, and by a patterning process using a ninth photomask, a drain electrode 6039 of the TFT of the sensor portion is formed. Though now shown in the figures, in the present embodiment, this electrodes is used as a three-layered electrode formed by continuously forming a Ti film at the thickness of 100 nm, a film of Al containing Ti at the thickness of 300 nm, and a Ti film at the thickness of 150 nm by sputtering.

Then, a metal film is formed in contact with the third interlayer insulating film 6059 and the drain electrode 6039 of the n-channel type TFT of the sensor portion. The metal film is formed and patterned to form a cathode electrode 6056 of a photoelectric conversion element. In the present embodiment, aluminum formed by sputtering is used as the metal film, but other metals may also be used. For example, a film formed by laminating a titanium film, an aluminum film, and a titanium film may be used.

Figure 7A:
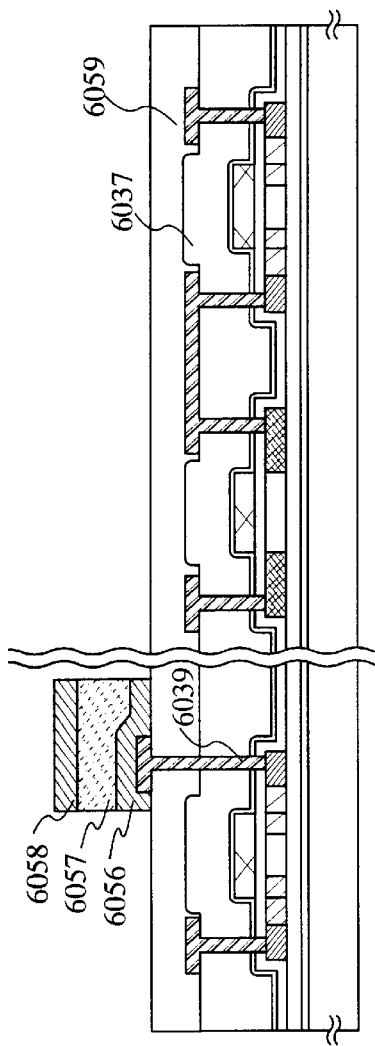
FIGS. 7A and B illustrate manufacturing steps of the contact area sensor according to Embodiment 1.

Next, an amorphous silicon film containing hydrogen (hereinafter referred to as an a-Si:H film) which functions as a photoelectric conversion layer is formed on the whole surface of the substrate and is patterned to form a photoelectric conversion layer 6057. Next, a transparent conductive film is formed on the whole surface of the substrate. In the present embodiment s the transparent conductive film, an ITO film is formed at the thickness of 200 nm by sputtering. The transparent conductive film is patterned to form an anode electrode 6058 (FIG. 7A).

Figure 7B:
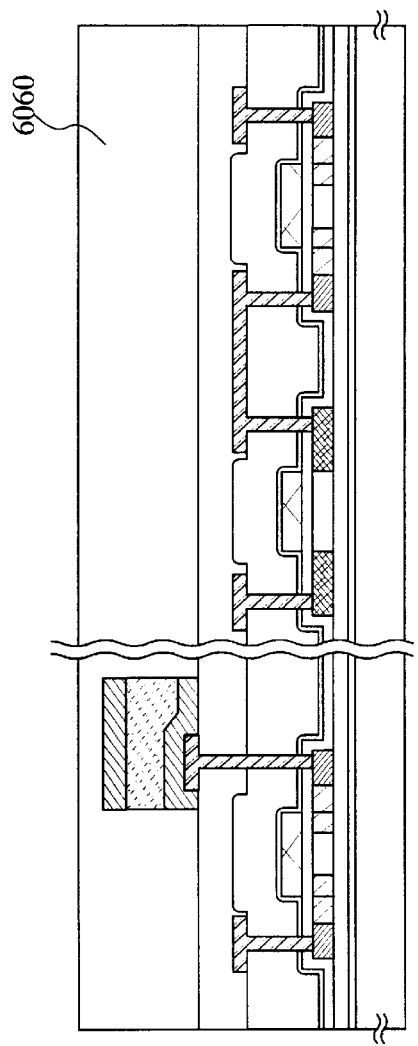

Then, a fourth interlayer insulating film 6060 is formed. As the fourth interlayer insulating film 6060, a resin film such as of polyimide, polyamide, polyimideamide, or acrylic is preferable, since a flat surface can be obtained. Alternatively, the film may be of a laminated structure where an upper layer of the fourth interlayer insulating film 6060 is the above-mentioned resin film while its lower layer is formed by forming a single-layered or multilayered film of an inorganic insulating material such as silicon oxide, silicon nitride, or silicon oxide nitride. In the present embodiment, a polyimide film at the thickness of 0.7 $\mu$m is formed as the insulating film on the whole surface of the substrate. Through the processes described in the above, a contact area sensor and its driving portion as shown in FIG. 7B are completed.

Though, in FIGS. 5A–7B, an example where the sensor portion has an n-channel type TFT, according to the present invention, the sensor portion may have a p-channel type TFT, or may have both an n-channel type TFT and a p-channel type TFT. Further, though the driving portion of the illustrated example has a CMOS circuit formed by a complementary combination of an n-channel type TFT and a p-channel type TFT, the driving portion may have an NMOS circuit using an n-channel type TFT, or may have a PMOS circuit using a p-channel type TFT.

In case the TFT of the sensor portion is a p-channel type TFT, it is preferable that the drain electrode 6039 of the photodiode is connected with the anode electrode 6058.

Embodiment 2

Figure 8:
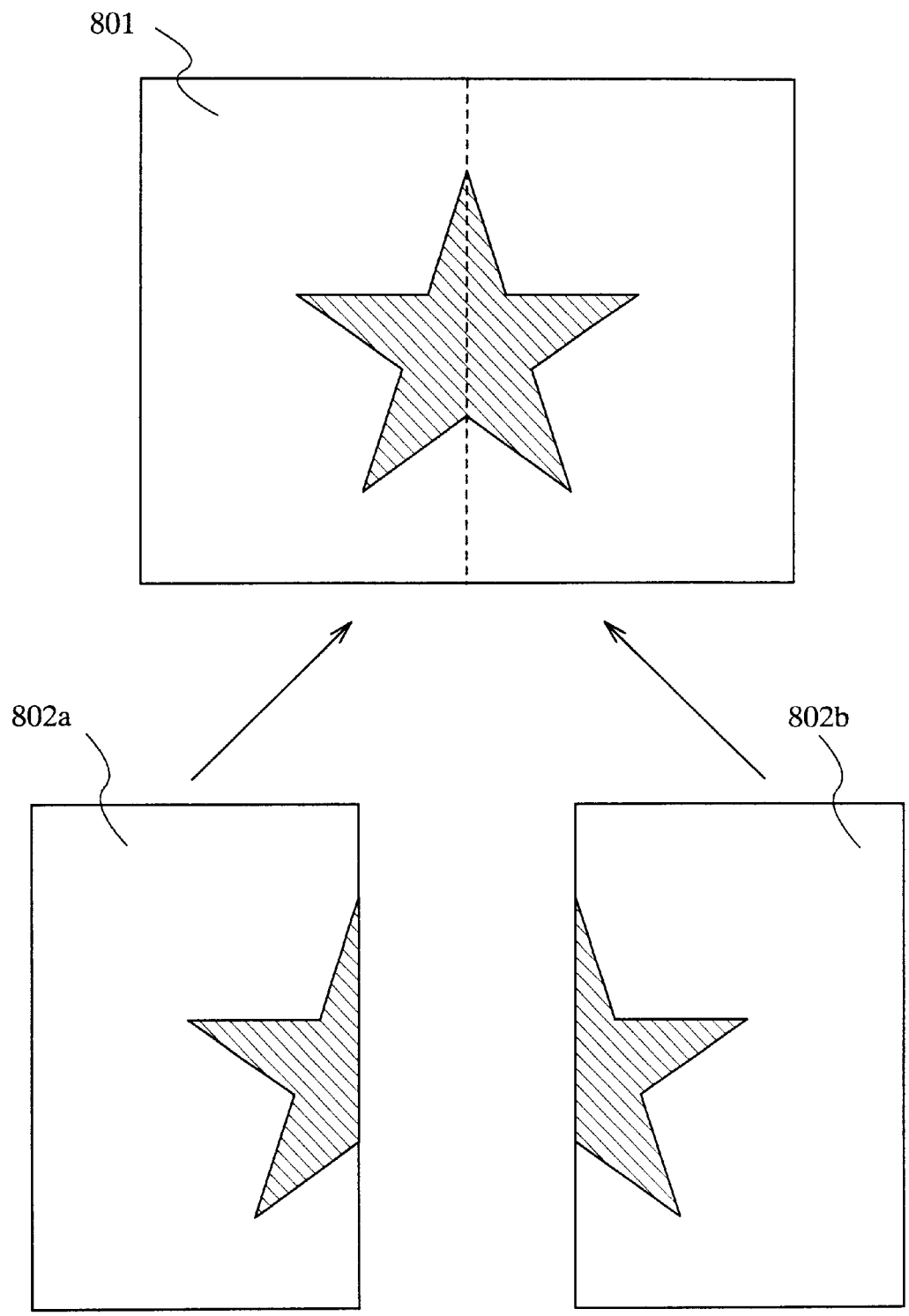
FIG. 8 is an explanatory view of the function as a synthesizer on a software of divided images according to Embodiment 2.

In the present embodiment, a function as a synthesizer on a software of a large area image dividedly read of the contact area sensor according to the present embodiment shown in Embodiment 1 is described with reference to FIG. 8.

When the contact area sensor can not read an image to be read just by one scanning, it is necessary to divide the reading into a plurality of readings and to synthesize the read images on a software. The image to be read is dividedly read into images of a readable size by the contact area sensor. In the present embodiment, the image to be read is dividedly read into two images, but the number of the divided images depends on the relationship between the contact area sensor and the size of the image. In the present embodiment, the image is divided into two images, i.e., divided images 8021a and 802b to be respectively read by the contact area sensor.

The read divided images 802a and 802b are synthesized on a software. In the synthesis on a software, by automatically matching the boundary on the side of the software, an image 803 is obtained. The synthesis of the divided images are not necessarily carried out automatically on the side of the software, and may be manually carried out. More specifically, the divided images 8021a and 802b may be moved manually by an operator, and the boundary may be matched by visual confirmation by the operator.

Such synthesis of divided images on a software makes it possible to read an image which is larger than the readable area by the area sensor.

Embodiment 3

In the present embodiment, the contact area sensor provided with TFTs according to the present embodiment as a photoelectric conversion element has a function as an OCR for organizing read letters as a data. According to the present invention, by adopting RGB light source switching as the driving method of image reading, the resolution of the image reading is made to be three times as much as that of a conventional structure where each of the pixels is provided with one among R, G, and B color filters, and highly precise image reading with high image quality is made possible. By tripling the resolution of the image reading, the organization of read letters as a data can be carried out with more certainty and more accuracy.

Embodiment 4

As an example of the contact area sensor provided with TFTs according to the present embodiment as a photoelectric conversion element, a portable hand scanner is described with reference to FIGS. 9A and 9B.

Figure 9A:
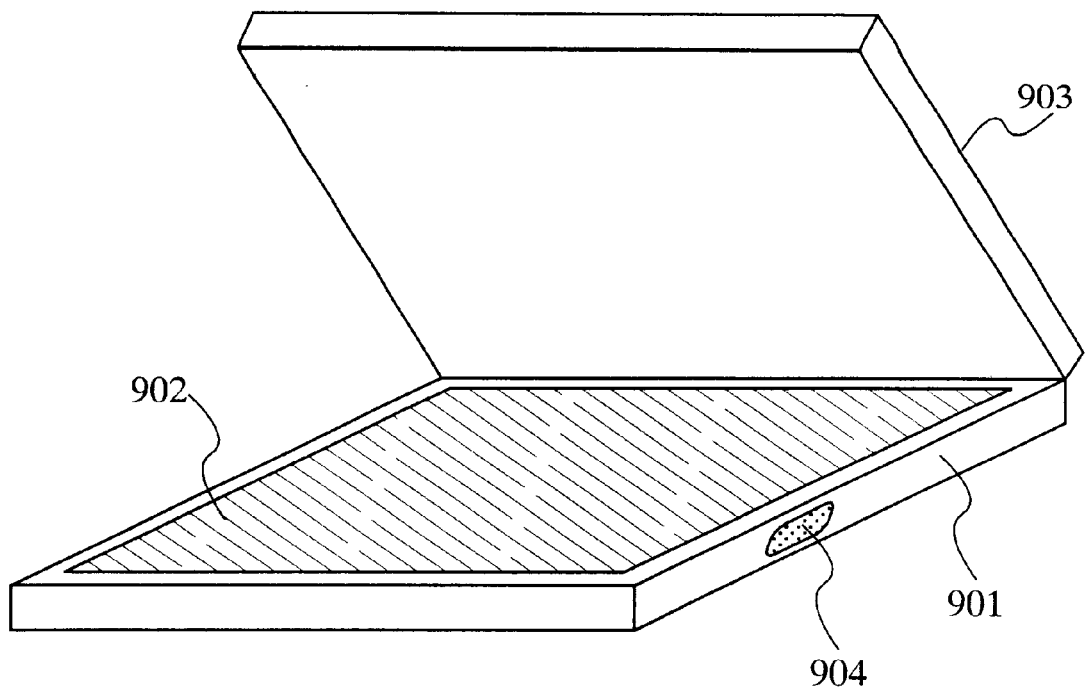
FIGS. 9A and B illustrate an example of a portable hand scanner according to Embodiment 4.
Figure 9B:
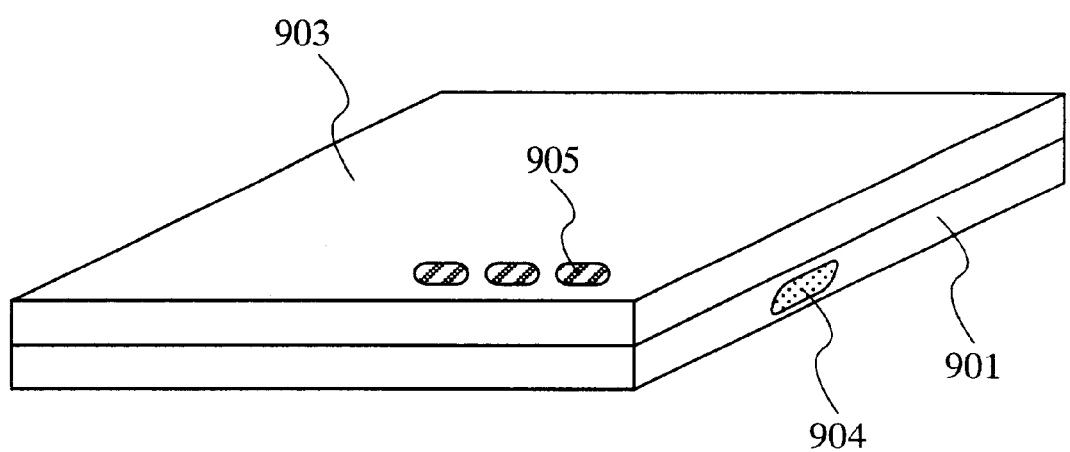

FIG. 9A illustrates a portable hand scanner formed of a main body 901, a contact area sensor 902, an upper cover 903, an external connection port 904, and a control switch 905. FIG. 9B illustrates the same portable hand scanner with the upper cover 903 closed.

Data of an image read by the contact area sensor 902 can be transferred through the external connection port 904 to an electronic apparatus connected with the portable hand scanner to, for example, make amendments to, synthesize, or edit the image on a software.

According to the present invention, by forming a contact area sensor comprising thin film transistors (TFTs) and photodiodes arranged in a matrix form, the contact area sensor itself can be made smaller, thinner, and lighter. Further, the trouble of scanning an object is alleviated, the operation is made easier, the power consumption is suppressed, and the sensor is made to withstand a shock. Further, it is made possible to form the peripheral circuit other than the contact area sensor on the same substrate on which the contact area sensor is formed by forming the peripheral circuit using thin film transistors. This makes it possible to make the contact area sensor further smaller, thinner, and lighter, and more portable contact area sensor can be formed.

Further, according to the present invention, lower power consumption is materialized by using LEDs as the light source. Further, by adopting RGB light source switching as the driving method of the light source, the resolution of the image reading is made to be three times as much as that of a conventional structure where each of the pixels is provided with one among R, G, and B color filters, and highly precise image reading with high image quality is made possible. Further, it is made possible to connect divided images on a software, and to read a large area image which is larger than the readable area by the area sensor. Further, the contact area sensor is structured to organize read letters as a data. By tripling the resolution of the image reading adopting RGB light source switching, the organization of read letters as a data can be carried out with more certainty and more accuracy. Still further, by forming a contact area sensor comprising thin film transistors (TFTs) and photodiodes, the size of the substrate can be freely defined, and it is made easier to dividedly read a large area image and connect the divided images on a software.

What is claimed is:

1. A contact area sensor comprising:
    a sensor substrate;
    a plurality of sensor portions being arranged in a matrix form over the sensor substrate;
    a backlight comprising a first light source for emitting a red light, a second light source for emitting a green light and a third light source for emitting a blue light;
    wherein each of the sensor portions comprises a photoelectric conversion element and a thin film transistor;
    said thin film transistor comprising:
        a semiconductor film over the sensor substrate, said semiconductor film comprising a source region, a drain region, a channel region between the source and drain regions, at least an impurity region between the channel region and one of the source and drain regions;
        wherein the impurity region includes an impurity at a concentration lower than each of the source and drain regions;
        a gate electrode over the semiconductor film with a gate insulating film interposed therebetween;
        wherein the impurity region comprises a first portion adjacent to the channel region and a second portion between the first portion and one of the source and drain regions;
        wherein the first portion is overlapped with the gate electrode while the second portion is not overlapped with the gate electrode;
    a first insulating film over the semiconductor film, the gate insulating film and the gate electrode;
    at least an electrode electrically connected to one of the source and drain regions and formed on the first insulating film;
    said photoelectric conversion element comprising:
        a first conductive film electrically connected to the electrode and formed on the first insulating film;
        a photoelectric conversion layer formed on the first conductive film;
        a second conductive film formed on the photoelectric conversion layer,
    wherein one frame period is defined as a period in which the plurality of sensor portions read one image,
    wherein the red, green, and blue lights are emitted in corresponding subframe periods,
    wherein each of the subframe periods is ⅓ of the one frame period.

2. A sensor according to claim 1, wherein each of the first, second and third light sources is a LED.

3. A contact area sensor comprising:
    a transparent substrate having an insulating surface;
    a plurality of sensor portions arranged in a matrix form over the transparent substrate;
    wherein each of the sensor portions comprises a photoelectric conversion element and a thin film transistor;
    said thin film transistor comprising:
        a semiconductor film over the transparent substrate, said semiconductor film comprising a source region, a drain region, a channel region between the source and drain regions, at least an impurity region between the channel region and one of the source and drain regions;
        wherein the impurity region includes an impurity at a concentration lower than each of the source and drain regions;
        a gate electrode over the semiconductor film with a gate insulating film interposed therebetween;
        wherein the impurity region comprises a first portion adjacent to the channel region and a second portion between the first portion and one of the source and drain regions;
        wherein the first portion is overlapped with the gate electrode while the second portion is not overlapped with the gate electrode;
    a first insulating film over the semiconductor film, the gate insulating film and the gate electrode;
    at least an electrode electrically connected to one of the source and drain regions and formed on the first insulating film;
    said photoelectric conversion element comprising:
        a first conductive film electrically connected to the electrode and formed on the first insulating film;
        a photoelectric conversion layer formed on the first conductive film;
        a second conductive film formed on the photoelectric conversion layer,
    wherein an image is dividedly read into a plurality of divisional images,
    wherein the plurality of divisional images are synthesized on a software.

4. A sensor according to claim 3,
wherein the gate electrode comprises at least an element selected from titanium (Ti), tantalum (Ta), tungsten (W), and molybdenum (Mo), and a compound thereof.

5. A sensor according to 1, wherein the contact area sensor has a function as an OCR.

6. A sensor according to claim 1, wherein the contact area sensor has a function as a synthesizer of a read image.

7. A sensor according to claim 1, wherein the contact area sensor is a portable hand scanner.

8. A sensor according to 3, wherein the contact area sensor has a function as an OCR.

9. A sensor according to claim 3, wherein the contact area sensor has a function as a synthesizer of a read image.

10. A sensor according to claim 3, wherein the contact area sensor is a portable hand scanner.

11. A sensor according to claim 1,
wherein the sensor substrate is transparent,
wherein the sensor substrate is one selected from the group consisting of a glass substrate, a plastic substrate, a ceramic substrate and a quartz substrate.

12. A sensor according to claim 1,
wherein the first conductive film comprises at least one selected from the group consisting of aluminum and titanium,
wherein the photoelectric conversion layer comprises amorphous silicon,
wherein the second conductive film comprises ITO.

13. A sensor according to claim 1, further comprising:
a second insulating film covering the first insulating film and the photoelectric conversion element,
wherein the second insulating film comprises at least one selected from the group consisting of polyimide, polyamide, polyimideamide and acrylic.

14. A sensor according to claim 1, further comprising:
a horizontal shift register over the sensor substrate;
a vertical shift register over the sensor substrate;
at least an analog switch over the sensor substrate, said analog switch being electrically connected to the horizontal shift register;
an image signal line over the sensor substrate, said image signal line being electrically connected to the analog switch;
at least a signal line over the sensor substrate, said signal line being electrically connected to the analog switch and one of the source and drain regions of the thin film transistor;
at least a scanning line over the sensor substrate, said scanning line being electrically connected to the gate electrode of the thin film transistor;
said contact area sensor being operated by the following steps:
supplying a first gate signal from the vertical shift register through the scanning line to the gate electrode of the thin film transistor;
turning on the thin film transistor so that one of the first and second conductive films of the photoelectric conversion element is in continuity with the one of the source and drain regions of the thin film transistor;
entering a light into the photoelectric conversion element;
photoelectrically converting the light in the photoelectric conversion element to generate data;
inputting the data as an image signal through the signal line to the analog switch;
supplying a second gate signal from the horizontal shift register to the analog switch so that the analog switch turns on;
outputting the image signal from the image signal line.

15. A sensor according to claim 3,
wherein the transparent substrate is one selected from the group consisting of a glass substrate, a plastic substrate, a ceramic substrate and a quartz substrate.

16. A sensor according to claim 3,
wherein the first conductive film comprises at least one selected from the group consisting of aluminum and titanium,
wherein the photoelectric conversion layer comprises amorphous silicon,
wherein the second conductive film comprises ITO.

17. A sensor according to claim 3, further comprising:
a second insulating film covering the first insulating film and the photoelectric conversion element,
wherein the second insulating film comprises at least one selected from the group consisting of polyimide, polyamide, polyimideamide and acrylic.

18. A sensor according to claim 3, further comprising:
a horizontal shift register over the transparent substrate;
a vertical shift register over the transparent substrate;
at least an analog switch over the transparent substrate, said analog switch being electrically connected to the horizontal shift register;
an image signal line over the transparent substrate, said image signal line being electrically connected to the analog switch;
at least a signal line over the transparent substrate, said signal line being electrically connected to the analog switch and one of the source and drain regions of the thin film transistor;
at least a scanning line over the transparent substrate, said scanning line being electrically connected to the gate electrode of the thin film transistor;
said contact area sensor being operated by the following steps:
supplying a first gate signal from the vertical shift register through the scanning line to the gate electrode of the thin film transistor;
turning on the thin film transistor so that one of the first and second conductive films of the photoelectric conversion element is in continuity with the one of the source and drain regions of the thin film transistor;
entering a light into the photoelectric conversion element;
photoelectrically converting the light in the photoelectric conversion element to generate data;
inputting the data as an image signal through the signal line to the analog switch;
supplying a second gate signal from the horizontal shift register to the analog switch so that the analog switch turns on;
outputting the image signal from the image signal line.

* * * * *